United States Patent
Elkin et al.

(10) Patent No.: US 8,890,573 B2
(45) Date of Patent: Nov. 18, 2014

(54) CLOCK GATING LATCH, METHOD OF OPERATION THEREOF AND INTEGRATED CIRCUIT EMPLOYING THE SAME

(75) Inventors: Ilyas Elkin, Sunnyvale, CA (US); Ge Yang, Dublin, CA (US); Jonah Alben, San Jose, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 13/606,582

(22) Filed: Sep. 7, 2012

(65) Prior Publication Data

US 2014/0070847 A1 Mar. 13, 2014

(51) Int. Cl.
*H03K 19/096* (2006.01)
*H03K 19/20* (2006.01)
*H03K 19/094* (2006.01)

(52) U.S. Cl.
USPC ............................................ 326/98; 326/112

(58) Field of Classification Search
USPC ............... 326/93, 95, 98, 112, 115, 119, 126, 326/127; 327/590, 108, 109
See application file for complete search history.

(56) References Cited

U.S. PATENT DOCUMENTS

| | | | |
|---|---|---|---|
| 6,549,040 B1* | 4/2003 | Alvandpour et al. | 326/98 |
| 7,053,663 B2* | 5/2006 | Hazucha et al. | 326/121 |
| 7,109,757 B2* | 9/2006 | Yuan et al. | 326/95 |
| 7,336,105 B2* | 2/2008 | Chuang et al. | 326/121 |
| 7,411,425 B2* | 8/2008 | Belluomini et al. | 326/121 |
| 7,902,878 B2* | 3/2011 | Saint-Laurent et al. | 326/98 |
| 2004/0257115 A1* | 12/2004 | Bertram et al. | 326/98 |
| 2004/0263209 A1* | 12/2004 | Choe | 326/98 |
| 2006/0026457 A1* | 2/2006 | Bernstein et al. | 714/6 |
| 2007/0290719 A1* | 12/2007 | Qureshi et al. | 326/95 |
| 2009/0302894 A1* | 12/2009 | Chuang et al. | 326/121 |
| 2010/0207677 A1* | 8/2010 | Trivedi et al. | 327/199 |

OTHER PUBLICATIONS

Saint-Laurent, M., et al., "A Low-Power Clock Gating Cell Optimized for Low-Voltage Operation in a 45-NM Technology," ISLPED '10, Aug. 18-20, 2010, ACM, pp. 159-163.

\* cited by examiner

*Primary Examiner* — Dylan White

(57) ABSTRACT

A clock gating latch, a method of gating a clock signal and an integrating circuit incorporating the clock gating latch or the method. In one embodiment, the clock gating latch includes: (1) a propagation circuit having a single, first switch configured to be driven by an input clock signal, (2) a keeper circuit coupled to the propagation circuit and having a single, first switch configured to be driven by the input clock signal and (3) an AND gate coupled to the propagation circuit and the keeper circuit and having an internal node coupled to a second switch in the propagation circuit and a second switch in the keeper circuit.

20 Claims, 2 Drawing Sheets

Figure 1:
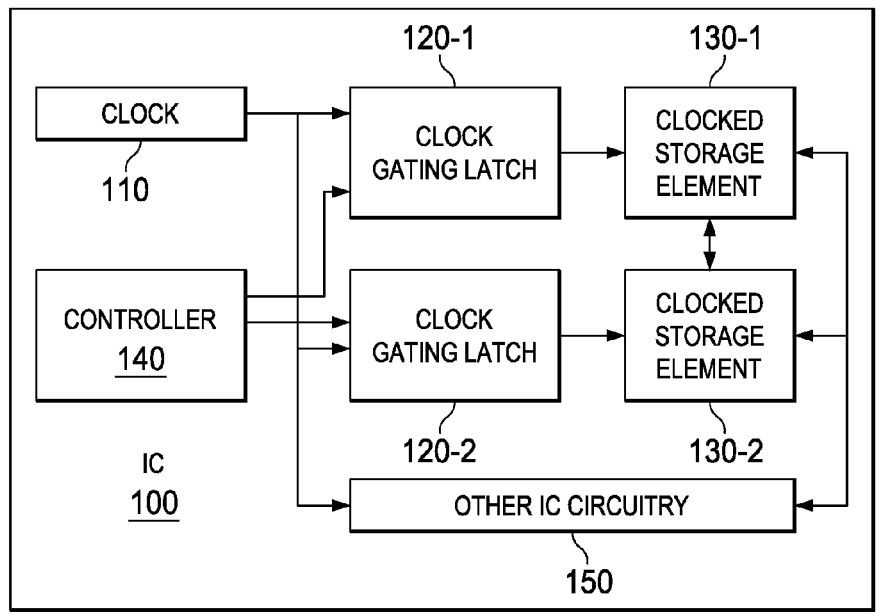

CLOCK GATING LATCH, METHOD OF OPERATION THEREOF AND INTEGRATED CIRCUIT EMPLOYING THE SAME

TECHNICAL FIELD

This application is directed, in general, to clock-driven integrated circuits (ICs) and, more specifically, to a clock gating latch for an IC and a method of operating the same.

BACKGROUND

For clock-driven ICs, the power consumed by the clock is a significant contributor to overall IC power consumption. Not only does the clock exhibit a high level of activity, it has a relatively large switching load. To address clock power consumption, clock gating latches have come into wide use in modern ICs. Clock gating latches are circuits configured to reduce clock power consumption by disabling the propagation of clock signals to clocked but inactive storage elements.

SUMMARY

One aspect provides a clock gating latch. In one embodiment, the clock gating latch includes: (1) a propagation circuit having a single, first switch configured to be driven by an input clock signal, (2) a keeper circuit coupled to the propagation circuit and having a single, first switch configured to be driven by the input clock signal and (3) an AND gate coupled to the propagation circuit and the keeper circuit and having an internal node coupled to a second switch in the propagation circuit and a second switch in the keeper circuit.

Another aspect provides a method of gating a clock signal. In one embodiment, the method includes: (1) asserting an enable signal to place a clock gating latch in an enabled mode in which the clock gating latch provides an output clock signal that is a function of an input clock signal and (2) deasserting the enable signal to place the clock gating latch in a disabled mode in which the output clock signal is disabled and the input clock signal drives at most a switch of a propagation circuit of the clock gating latch, a switch of a keeper circuit of the clock gating latch and an input of an AND gate of the clock gating latch.

Yet another aspect provides an IC. In one embodiment, the IC includes: (1) a clock, (2) a plurality of clock gating latches coupled to the clock. Each of the plurality of clock gating latches has: (2a) a propagation circuit having a single, first switch configured to be driven by an input clock signal, (2b) a keeper circuit coupled to the propagation circuit and having a single, first switch configured to be driven by the input clock signal and (2c) an AND gate coupled to the propagation circuit and the keeper circuit and having an internal node coupled to a second switch in the propagation circuit and a second switch in the keeper circuit. The IC further includes: (3) a corresponding plurality of clocked storage elements coupled to the plurality of clock gating latches, (4) other IC circuitry and (5) a controller coupled to the plurality of clock gating latches and configured to assert an enable signal to place one of the plurality of clock gating latches in an enabled mode in which the clock gating latch provides an output clock signal that is a function of an input clock signal and deassert the enable signal to place the one of the plurality of clock gating latches in a disabled mode in which the output clock signal is disabled and the input clock signal drives at most a switch of a propagation circuit of the clock gating latch and a switch of a keeper circuit of the clock gating latch.

BRIEF DESCRIPTION

Figure 2:
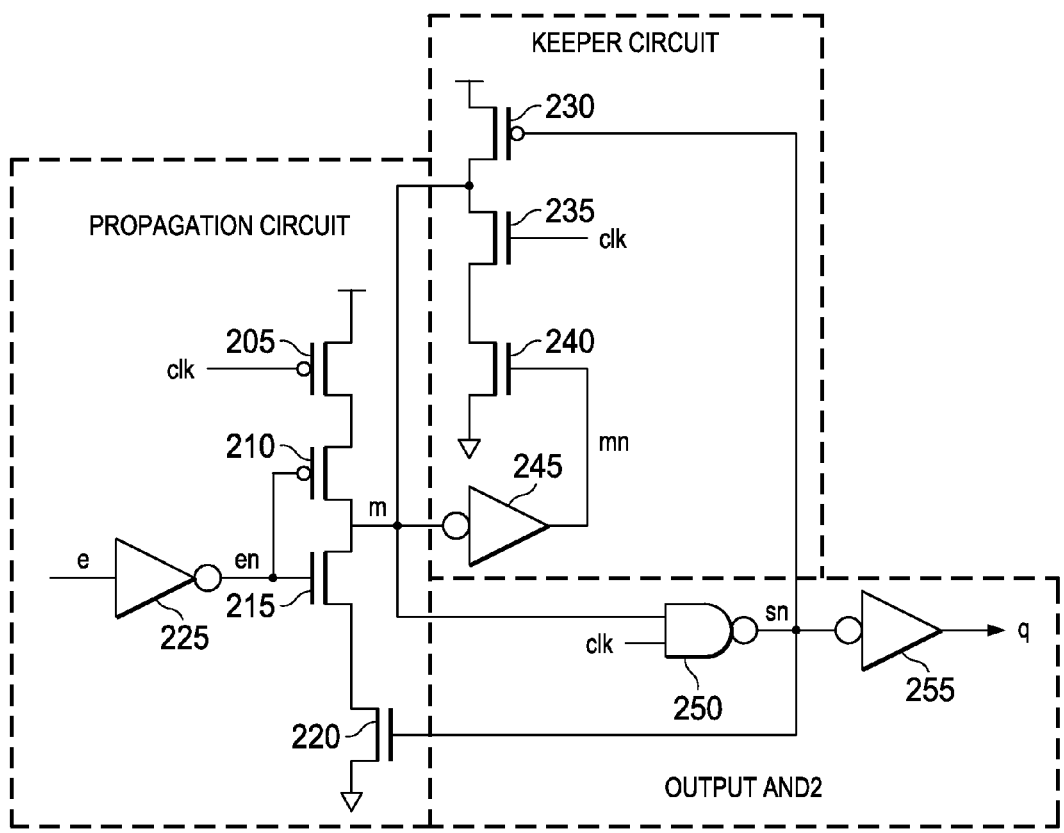
Figure 3:
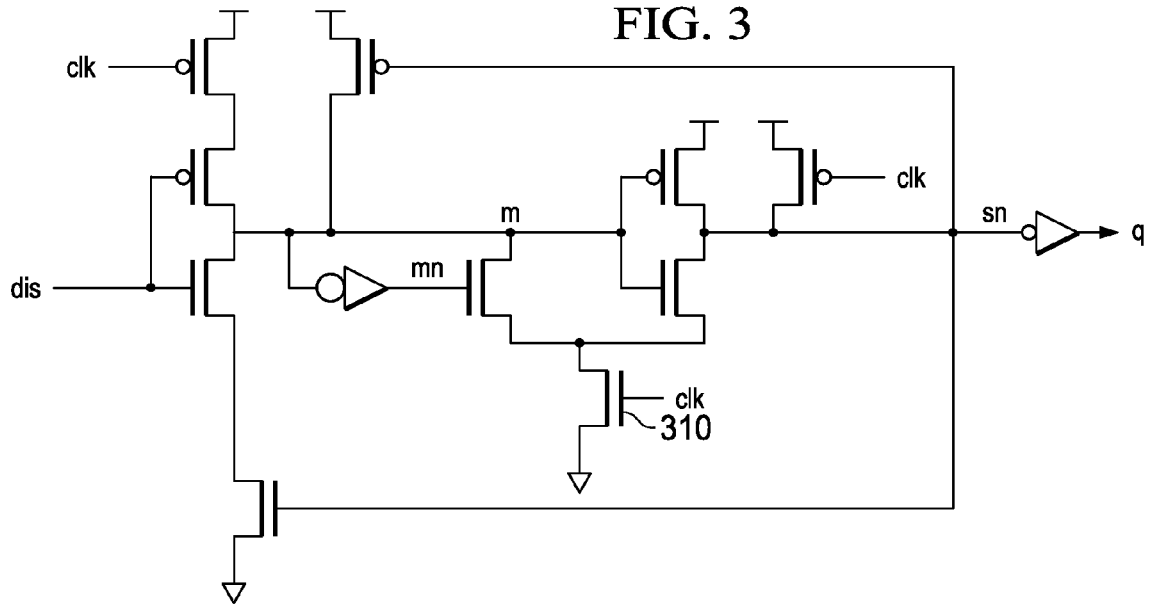
Figure 4:
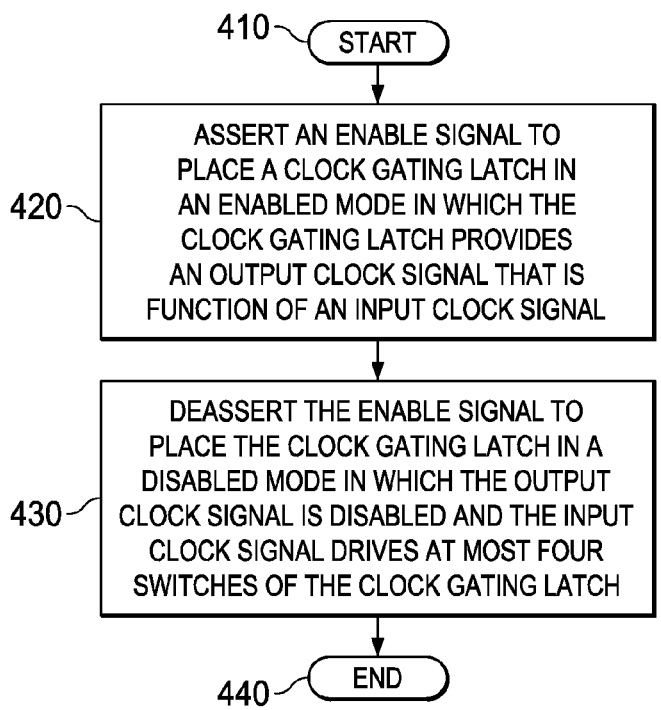

Reference is now made to the following descriptions taken in conjunction with the accompanying drawings, in which:
FIG. 1 is a block diagram of an IC;
FIG. 2 is a schematic diagram of one embodiment of a clock gating latch;
FIG. 3 is a schematic diagram of another embodiment of a clock gating latch; and
FIG. 4 is a flow diagram of one embodiment of a method of gating a clock signal.

DETAILED DESCRIPTION

As stated above, clock gating latches are circuits configured to reduce clock power consumption by disabling the propagation of clock signals to clocked but inactive storage elements. Unfortunately, clock gating latches are themselves clocked storage elements, and as such consume clock power. More specifically, assuming the clock signal provided to the clock gating latch is active and not somehow disabled upstream of the clock gating latch, the portion of the clock gating latch that receives the input clock signal continues to switch even when the latch disables the clock signal to downstream circuitry.

As those skilled in the pertinent art are aware, a clock gating latch usually takes the form of a low-phase latch, allowing it to store an enable value and guarantee that the clock gating latch has complete overlap with the high phase of an incoming clock signal. Conventional clock gating latches also include a two-input AND (AND2) gate, which allows the stored enable value to gate the clock signal.

A conventional pass-gate latch includes both a pass gate and a keeper and requires both true (clkP) and complement (clkN) forms of the input clock signal (clk) to be generated to drive the latch. An inverter is required to generate ClkN. ClkP can be generated directly from clk or by inverting ClkN with an additional inverter. Clk is employed to drive an input of the AND2 gate. ClkN is employed to drive an n-channel field-effect transistor (NFET) switch in the pass gate and a p-channel field-effect transistor (PFET) switch in the keeper, whereas ClkP drives a PFET switch in the pass gate and an NFET switch in the keeper, to guarantee that the latch remains writable on the low phase of Clk, and maintains its stored value when Clk is high. In some pass-gate latches, ClkP and ClkN also drive a PFET switch in the pass gate and an NFET switch in the keeper. Together with two transistors in the AND2 gate, a conventional pass-gate latch requires at least eight switches to remain clocked even when the output clock is disabled. Each of these switches consumes power. Some conventional pass-gate latches buffer clkP instead of using clk, requiring at least ten switches to remain clocked at all times.

It is realized herein that a less power-consumptive clock gating latch can be employed in an IC to save substantial power. It is further realized herein that a clock gating latch may be rendered less power-consumptive by reducing the number of components in the latch that switch irrespective of whether or not the latch is enabled. Accordingly, introduced herein are various embodiments of a clock gating latch and a method of and gating a clock signal in which the number of switches that remain clocked in the latch is reduced. Certain embodiments of the clock gating latch and method require as few as three switches to remain clocked in the latch. Certain other embodiments of the clock gating latch and method require fewer switches overall, allowing the latch and method to be implemented over a smaller area of an IC.

FIG. 1 is a block diagram of an IC 100. The IC 100 includes a clock 110 configured to generate a clock signal, which serves as an input clock signal to various clock gating latches. Although the IC 100 may contain far more clock gating latches, FIG. 1 shows clock gating latches 120-1, 120-2 coupled to the clock 110 to receive the input clock signal therefrom. The clock gating latches 120-1, 120-2 gate the input clock signal, either enabling the clock signal to drive, or disabling the clock signal from driving, corresponding clocked storage elements 130-1, 130-2 by providing an output clock signal. A controller 140 is coupled to the clock gating latches 120-1, 120-2 and is configured to generate respective enable signals that cause the clock gating latches 120-1, 120-2 to enable or disable the clock signals. Other IC circuitry 150 exists as part of the IC 100 and may include further clock gating latches and clocked storage elements (not shown).

FIG. 2 is a schematic diagram of one embodiment of a clock gating latch. The clock gating latch is configured to receive an input clock signal clk (e.g., from the clock 110 of FIG. 1) and an enable signal e (e.g., from the controller 140 of FIG. 1) and provide a gated output clock signal q based on clk and e. More specifically, q is enabled (has substantially the same frequency and phase as clk) when e is asserted and is disabled (has a frequency of zero) when e is disabled.

The clock gating latch has a propagation circuit including switches 205, 210, 215, 220 and an inverter 225. The switches 205, 210 provide a pull-up component of the propagation circuit, and the switches 215, 220 provide a pull-down component of the propagation circuit. The sources and drains of the switches 205, 210, 215, 220 are coupled such that the switches are coupled in series between a nonzero supply voltage and ground as shown. In the embodiment of FIG. 2, the switches 205, 210 are PFETs, and the switches 215, 220 are NFETs. The switch 205 is configured to receive clk at its gate as shown. The inverter 225 is configured to receive e and provides a complementary enable signal en. An alternative embodiment of the clock gating latch is configured to receive en (e.g., from the controller 140 of FIG. 1) and accordingly omits the inverter 225. The switches 210, 215 receive are configured to receive en at their gates as shown.

The clock gating latch also has a keeper circuit including switches 230, 235, 240 and an inverter 245. The switch 230 provides a pull-up component of the keeper circuit, and the switches 235, 240 provide a pull-down component of the keeper circuit. Like the switches 205, 210, 215, 220, the sources and drains of the switches 230, 235, 240 are coupled in series between the nonzero supply voltage and ground as shown. In the embodiment of FIG. 2, the switch 230 is a PFET, and the switches 235, 240 are NFETs. The switch 235 is configured to receive clk at its gate as shown.

A first node is defined between the switches 210, 215 as shown. A signal m developed at the first node is provided to an inverter 245 and a first input of an AND2 gate. In the embodiment of FIG. 2, the AND2 gate is formed by a combination of a NAND2 gate 250 and an inverter 255. The inverter 245 is configured to provide a signal mn, which is the complement of the signal m, to the gate of the switch 240. The node m is further coupled between the switches 230, 235 as shown, providing a feedback path for the keeper circuit.

A second node is defined at an internal node of the AND2 gate (formed by the NAND2 gate 250 and the inverter 255. In FIG. 2, the second node is located between the NAND2 gate 250 and the inverter 255. A signal sn developed at the second node is provided to the switches 220, 230 (as well as the inverter 255). Finally, a second input of the NAND2 gate 250 receives clk.

As implied above, the clock gating latch operates in two modes: an enabled mode when the enable signal e is asserted, and a disabled mode when e is deasserted before the rising edge of clk. In the illustrated embodiment, e is asserted when it is transitioned to a logical high and deasserted when transitioned to a logical low.

When clk is low, the switch 205 is ON (closed, or conducting), sn is high, the switch 220 is on, the switches 230 and 235 are OFF (open, or nonconducting), and q is low. Therefore, the propagation circuit is enabled and the keeper circuit is disabled, consistent with the desired logic function of a low phase latch when clock is low. A transition in input e results in complementary signal en being propagated via the inverter 225 to the switches 210, 215. As the switches 220, 205 are ON, the switches 210, 215 act as an inverter and result in e being propagated to m. The inverter 245 further causes en to be propagated to the node mn. Therefore, while clk is low, e is allowed to propagate through the propagation circuit, but the low phase of clk prevents m from being propagated through the AND2 gate 250. Thus sn is maintained high, and, by virtue of the inverter 255, q is maintained low. Thus clk only drives four switches: the switch 205, the switch 235 and two switches internal to the NAND2 gate 250. All other switches are isolated from clk.

When the enabled mode is desired, e is asserted and en transitions low. While clk is low, m transitions high, and mn transitions low. Subsequently, when clk transitions high, sn transitions low, and the switches 235, 230 turn ON, activating the keeper circuit. The switches 205, 220 turn OFF, deactivating the propagation circuit. The activation of the keeper circuit and the deactivation of the propagation circuit are consistent with desired logic function of a low-phase latch when clk is high. Because the switch 230 maintains m high, clk determines sn (the output of the NAND2 gate 250), causing q to follow clk and driving one or more clocked storage elements downstream of the clock gating latch of FIG. 2 (e.g., the clocked storage element 130-1 or the clocked storage element 130-2 of FIG. 1). As the propagation circuit is disabled, transitions in input e are precluded from propagating to m, and as the keeper circuit is enabled, m maintains a high value, and sn is guaranteed to remain low, guaranteeing that q remains high for the entire duration of the high phase of clk, consistent with the desired logic function of the clock gating latch.

When the disabled mode is desired, e is deasserted and en transitions high. When clk is low, m transitions low, and mn transitions high, turning the switch 240 ON. Subsequently, when clk transitions high, sn remains high, and switch 230 remains OFF. The switch 235 also turns ON, maintaining m low through the switches 235, 240. The switch 205 turns OFF, deactivating the pull-up component of the propagation circuit represented by switches 210,205. The deactivation of the pull-up component of the propagation circuit prevents a rising transition of input e from propagating to m, and the activation of the keeper circuit maintains a low value on m, which is consistent with the desired logic function of a low-phase latch when clk is high. As a result of m maintaining a low value of signal m through the high phase of clk, the AND2 gate 250 maintains a high value on signal sn, and the inverter 255 maintains a low value on q, which is consistent with the desired logic function of a clock gating latch. As demonstrated above, the embodiment of FIG. 2 is consistent with the desired logic function of a clock gating latch, which is that a low phase latched enable signal gating a clocked AND2.

FIG. 3 is a schematic diagram of another embodiment of a clock gating latch. The clock gating latch of FIG. 3 has the same logical operation as the clock gating latch of FIG. 2.

However, a disable signal dis drives the latch instead of the enable signal e of FIG. 2. Also, as is apparent, a clk-gated switch is shared between a NAND2 portion of the AND2 gate and the pull-down component of the keeper circuit. Therefore only three switches remain clocked in the disabled mode. This is as opposed to the four switches in the clock gating latch of FIG. 2.

FIG. 4 is a flow diagram of one embodiment of a method of gating a clock signal. The method begins in a start step 410. In a step 420, an enable signal is asserted to place a clock gating latch in an enabled mode in which the clock gating latch provides an output clock signal that is a function of an input clock signal. In a step 430, the enable signal is deasserted to place the clock gating latch in a disabled mode in which the output clock signal is disabled and the input clock signal drives at most a switch of a propagation circuit of the clock gating latch and a switch of a keeper circuit of the clock gating latch. In one embodiment, the input clock signal further drives at most an input of an AND gate of the clock gating latch. The method ends in an end step 440.

Those skilled in the art to which this application relates will appreciate that other and further additions, deletions, substitutions and modifications may be made to the described embodiments.

What is claimed is:

1. A clock gating latch, comprising:
    a propagation circuit having a single, first switch configured to be driven by an input clock signal;
    a keeper circuit coupled to said propagation circuit and having a single, first switch configured to be driven by said input clock signal; and
    an AND gate coupled to said propagation circuit and said keeper circuit and having an internal node coupled to a second switch in said propagation circuit and a second switch in said keeper circuit, wherein said first switch of said keeper circuit is shared between said AND gate and said keeper circuit.

2. The clock gating latch as recited in claim 1 wherein said clock gating latch has a first node located between third and fourth switches of said propagation circuit and an inverter of said keeper circuit, said node coupled to a first input of said AND gate and between said first and second switches of said keeper circuit.

3. The clock gating latch as recited in claim 1 wherein said AND gate is formed by a combination of a NAND gate and an inverter, said internal node located between said NAND gate and said inverter.

4. The clock gating latch as recited in claim 1 wherein a high state of said input clock signal prevents a signal provided via second switch of said propagation circuit from driving an inverter in said keeper circuit and said AND gate.

5. The clock gating latch as recited in claim 1 wherein said first switch of said propagation circuit is a PFET switch and said first switch of said keeper circuit is an NFET switch.

6. The clock gating latch as recited in claim 1 wherein said second switch of said propagation circuit is an NFET switch and said second switch of said keeper circuit is a PFET switch.

7. The clock gating latch as recited in claim 1 wherein said AND gate is an AND2 gate.

8. A method of gating a clock signal, comprising:
    asserting an enable signal to place a clock gating latch in an enabled mode in which said clock gating latch provides an output clock signal that is a function of an input clock signal; and
    deasserting said enable signal to place said clock gating latch in a disabled mode in which said output clock signal is disabled and said input clock signal drives at most a switch of a propagation circuit of said clock gating latch, a switch of a keeper circuit of said clock gating latch and an input of an AND gate of said clock gating latch.

9. The method as recited in claim 8 further comprising employing an internal node of said AND gate to drive a second switch of said propagation circuit and a second switch of said keeper circuit only when said clock gating latch is in said enabled mode.

10. The method as recited in claim 8 wherein said AND gate is formed by a combination of a NAND gate and an inverter, said internal node located between said NAND gate and said inverter.

11. The method as recited in claim 8 further comprising employing a high state of said input clock signal to prevent a signal provided via second switch of said propagation circuit from driving an inverter in said keeper circuit and said AND gate.

12. The method as recited in claim 8 wherein said first switch of said propagation circuit is a PFET switch and said first switch of said keeper circuit is an NFET switch.

13. The method as recited in claim 8 wherein said second switch of said propagation circuit is an NFET switch and said second switch of said keeper circuit is a PFET switch.

14. The method as recited in claim 8 wherein said AND gate is an AND2 gate.

15. An integrated circuit, comprising:
    a clock;
    a plurality of clock gating latches coupled to said clock, each of said plurality of clock gating latches including:
        a propagation circuit having a single, first switch configured to be driven by an input clock signal,
        a keeper circuit coupled to said propagation circuit and having a single, first switch configured to be driven by said input clock signal, and
        an AND gate coupled to said propagation circuit and said keeper circuit and having an internal node coupled to a second switch in said propagation circuit and a second switch in said keeper circuit;
    a corresponding plurality of clocked storage elements coupled to said plurality of clock gating latches;
    other IC circuitry; and
    a controller coupled to said plurality of clock gating latches and configured to assert an enable signal to place one of said plurality of clock gating latches in an enabled mode in which said clock gating latch provides an output clock signal that is a function of an input clock signal and deassert said enable signal to place said one of said plurality of clock gating latches in a disabled mode in which said output clock signal is disabled and said input clock signal drives at most a switch of a propagation circuit of said clock gating latch, a switch of a keeper circuit of said clock gating latch and an input of an AND gate of said clock gating latch.

16. The integrated circuit as recited in claim 15 wherein said clock gating latch has a first node located between third and fourth switches of said propagation circuit and an inverter of said keeper circuit, said node coupled to a first input of said AND gate and between said first and second switches of said keeper circuit.

17. The integrated circuit as recited in claim 15 wherein said AND gate is formed by a combination of a NAND gate and an inverter, said internal node located between said NAND gate and said inverter.

18. The integrated circuit as recited in claim 15 wherein a high state of said input clock signal prevents a signal provided via second switch of said propagation circuit from driving an inverter in said keeper circuit and said AND gate.

19. The integrated circuit as recited in claim 15 wherein said first switch of said propagation circuit is a PFET switch, said first switch of said keeper circuit is an NFET switch, said second switch of said propagation circuit is an NFET switch and said second switch of said keeper circuit is a PFET switch.

20. The integrated circuit as recited in claim 15 wherein said AND gate is an AND2 gate.

* * * * *